US008178208B2

(12) United States Patent
Konduri

(10) Patent No.: US 8,178,208 B2
(45) Date of Patent: May 15, 2012

(54) POLYESTER COMPOSITIONS, METHODS OF MANUFACTURE, AND USES THEREOF

(75) Inventor: Rama Konduri, Evansville, IN (US)

(73) Assignee: Sabic Innovative Plastives IP B.V. (NL)

( * ) Notice: Subject to any disclaimer, the term of this patent is extended or adjusted under 35 U.S.C. 154(b) by 754 days.

(21) Appl. No.: 11/567,518

(22) Filed: Dec. 6, 2006

(65) Prior Publication Data
US 2008/0132630 A1 Jun. 5, 2008

Related U.S. Application Data

(60) Provisional application No. 60/868,197, filed on Dec. 1, 2006.

(51) Int. Cl.
B32B 15/08 (2006.01)
B32B 15/04 (2006.01)
B32B 27/06 (2006.01)
H05B 6/00 (2006.01)
C23C 4/08 (2006.01)
C08J 3/22 (2006.01)
C08G 63/60 (2006.01)
C08F 283/02 (2006.01)

(52) U.S. Cl. ........ 428/458; 428/457; 428/480; 264/478; 427/455; 524/451; 524/605; 524/513

(58) Field of Classification Search .................. 524/414, 524/451, 605, 513; 427/111, 455; 428/458, 428/457, 480; 264/478
See application file for complete search history.

(56) References Cited

U.S. PATENT DOCUMENTS

| | | | | |
|---|---|---|---|---|
| 3,169,121 | A | | 2/1965 | Goldberg |
| 3,867,478 | A | * | 2/1975 | Chimura et al. ............ 524/150 |
| 4,123,473 | A | * | 10/1978 | Amin et al. .................. 525/439 |
| 4,238,596 | A | | 12/1980 | Quinn |
| 4,238,597 | A | | 12/1980 | Markezich et al. |
| 4,276,208 | A | * | 6/1981 | Ogawa et al. ................ 523/217 |
| 4,414,352 | A | * | 11/1983 | Cohen et al. ................. 524/443 |
| 4,460,731 | A | * | 7/1984 | Kochanowski et al. ...... 524/451 |
| 4,506,043 | A | | 3/1985 | Ogawa et al. |
| 4,664,983 | A | * | 5/1987 | Nakamura et al. ........... 428/458 |
| 4,778,858 | A | * | 10/1988 | Ginnings .................... 525/425 |
| 4,900,610 | A | * | 2/1990 | Hochberg et al. .......... 428/195.1 |
| 5,039,727 | A | | 8/1991 | Onishi et al. |
| 5,114,996 | A | * | 5/1992 | Golder et al. ................ 523/506 |
| 5,493,483 | A | | 2/1996 | Lake |
| 5,496,880 | A | * | 3/1996 | Heuseveldt et al. ......... 524/417 |
| 5,563,222 | A | | 10/1996 | Fukuda et al. |
| 5,626,413 | A | * | 5/1997 | Ferrell ........................ 362/549 |
| 5,636,413 | A | | 6/1997 | Berg et al. |
| 5,916,496 | A | * | 6/1999 | Weber ........................ 264/1.9 |
| 6,362,269 | B1 | * | 3/2002 | Ishihata et al. ............... 524/449 |
| 2002/0154407 | A1 | | 10/2002 | Frazier |
| 2003/0022969 | A1 | * | 1/2003 | Gosens et al. ............... 524/101 |
| 2004/0116603 | A1 | | 6/2004 | Kobayashi et al. |
| 2004/0209984 | A1 | | 10/2004 | Geprags |
| 2006/0100330 | A1 | | 5/2006 | Natarajan et al. |
| 2006/0167162 | A1 | | 7/2006 | Geprags |
| 2007/0117897 | A1 | | 5/2007 | Onda et al. |

FOREIGN PATENT DOCUMENTS

| | | |
|---|---|---|
| JP | 02-124934 | 5/1990 |
| JP | 4053868 | 2/1992 |
| JP | 08-208959 | 8/1996 |
| JP | 11-241006 | 9/1999 |
| JP | 11-293099 | 10/1999 |
| JP | 2000-035509 | 2/2000 |
| JP | 2000-212294 | 8/2000 |
| JP | 2001064499 | 3/2001 |
| JP | 2001-316573 | 11/2001 |
| JP | 2002-179895 | 6/2002 |
| JP | 2002-294042 | 10/2002 |
| JP | 2003-261750 | 9/2003 |
| JP | 2004-250636 | 9/2004 |
| JP | 2005-041977 | 2/2005 |
| JP | 2005-194300 | 7/2005 |
| KR | 20020062403 | 7/2002 |
| WO | WO2004106405 | * 12/2004 |

OTHER PUBLICATIONS

English language translation of KR 2002-0062403 p. 1-6.*
ULTRATALC Product Literature, p. 1.*
W. F. H. Borman Molecular Weight-Viscosity Relationships for Poly(1,4-butylene Terephthalate), Journal of Applied Polymer Science, col. 22 pp. 2119-2126 (1978).*

(Continued)

Primary Examiner — Basia Ridley
Assistant Examiner — Alexander Kollias
(74) Attorney, Agent, or Firm — Cantor Colburn LLP; Diderico van Eyl

(57) ABSTRACT

A composition is disclosed, comprising, based on the total weight of the composition, a combination of from 44 to 80 weight percent of a thermoplastic poly(butylene terephthalate); from 20 to 50 weight percent of a thermoplastic poly (ethylene terephthalate) having an intrinsic viscosity of 0.5 to 0.8 deciliters per gram, measured in a 60:40 by weight phenol/1,1,2,2-tetrachloroethane mixture at 23° C. using a relative viscometer operating with a closed loop system, which measures the solvent and sample viscosity simultaneously; from 5 to less than 20 weight percent of a talc filler having an average largest dimension of less than 0.9 micrometers, a median particle size of less than 0.9 micrometers, or both; and from 0.1 to 0.5 weight percent of a mold release agent. The compositions are useful in the manufacture of lighting articles, which can be directly metallized without the inclusion of a base coat.

23 Claims, 1 Drawing Sheet

OTHER PUBLICATIONS

M. L. Wallch, Die Makromolekulare Chemie, "Viscosity-molecular weight relation and unperturbed dimensions of polyethylene terephthalate", vol. 103 Issue 1 pp. 19-26 (1967).*

International Search Report; International Application No. PCT/US2007/076761, International Filing Date Aug. 24, 2007; File Reference No. 218475-3; Date of Mailing Dec. 20, 2007 (6 pages).

Written Opinion for International Application No. PCT/US2007/076761, International Filing Date Aug. 24, 2007, (7 pages).

Korean Patent Application No. 20020062403, Published Jul. 26, 2002, Abstract Only, 1 page.

Korean Patent Application No. 20030079000, Published Oct. 10, 2003, Abstract Only, 1 page.

Japanese Patent Application No. 4053868, Published Feb. 21, 1992, Abstract Only, 1 page.

Japanese Patent Application No. 2001064499, Published Mar. 13, 2001, Abstract Only, 1 page.

F. Billmeyer, Jr. "Textbook of Polymer Science," 3rd Edition, 1984, pp. 457-459, John Wiley & Sons, Inc., New York, NY USA.

R. Lewis Sr., "Hawley's Condensed Chemical Dictionary," 13th Edition, 1993, p. 896, John Wiley & Sons, Inc., New York, NY USA.

* cited by examiner

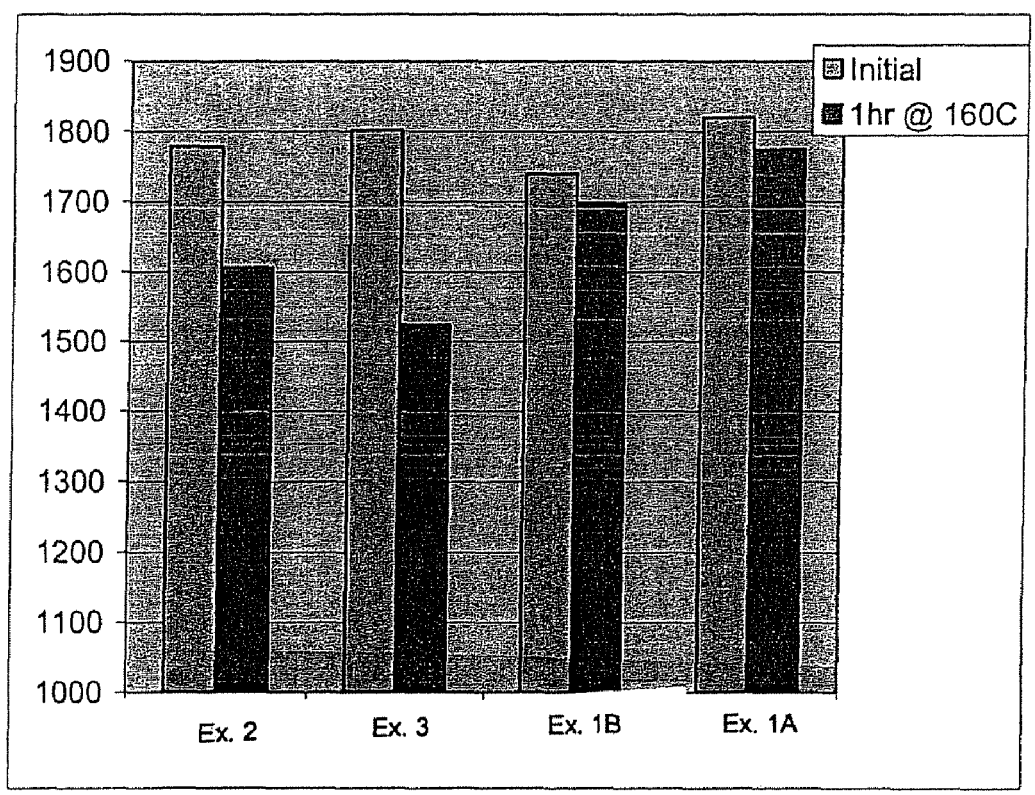

POLYESTER COMPOSITIONS, METHODS OF MANUFACTURE, AND USES THEREOF

CROSS-REFERENCE TO RELATED APPLICATION

This application claims priority to U.S. Patent Application Ser. No. 60/868,197, filed Dec. 1, 2006, which is incorporated herein by reference in its entirety.

BACKGROUND OF THE INVENTION

This invention relates to thermoplastic compositions, in particular filled polyester compositions, their method of manufacture, and uses of the compositions.

Molded articles comprising thermoplastic polymers are useful in the manufacture of optical reflectors, for example in automotive headlight extensions, bezels and reflectors, for indoor illumination, for vehicle interior illumination and the like. To provide adequate reflection, a surface of the molded article is coated with a reflective layer, typically a vapor deposited film of metal.

Polyesters are often used for such molded items because of their high thermal and flow properties. However, because the surfaces of the molded articles do not ordinarily possess satisfactory gloss or have some roughness, the surface is treated with a primer as an undercoat before vapor deposition of the reflective surface. Such primer treatment adds a processing cost, so improvements are sought so that vapor deposition can be performed directly on the molded item.

Surface roughness often arises from the inclusion of fillers in the polyester compositions. Fillers can impart dimensional stability to the molded articles, and in particular can decrease shrinkage of the article upon cooling in the mold. It is, therefore, desirable to develop polyester compositions that can be formed into molded items that have extremely high gloss, no surface defects visual to the eye, and low shrinkage. It would be an additional advantage if other advantageous properties of polyester compositions could be obtained, for example low out-gassing on heat treatment (which can cloud the metallized surface), and clean de-molding. It would be a further advantage if the compositions could be used in the manufacture of articles having an excellent appearance after metallization without a separate undercoating operation.

SUMMARY OF THE INVENTION

Disclosed herein is a composition comprising, based on the total weight of the composition, a combination of from 44 to 80 weight percent of a thermoplastic poly(butylene terephthalate); from 20 to 50 weight percent of a thermoplastic poly(ethylene terephthalate) having an intrinsic viscosity of 0.5 to 0.8 deciliters per gram, measured in a 60:40 by weight phenol/1,1,2,2-tetrachloroethane mixture at 23° C. using a relative viscometer operating with a closed loop system, which measures the solvent and sample viscosity simultaneously; from 5 to less than 20 weight percent of a talc filler having an average largest dimension of less than 0.9 micrometers, a median particle size of less than 0.9 micrometers, or both; and from 0.1 to 0.5 weight percent of a mold release agent.

In another embodiment, a composition comprises, based on the total weight of the composition, a combination of from 50 to 70 weight percent of a thermoplastic poly(butylene terephthalate); from 25 to 35 weight percent of a thermoplastic poly(ethylene terephthalate) having an intrinsic viscosity of 0.5 to 0.8 deciliters per gram, measured in a 60:40 by weight phenol/1,1,2,2-tetrachloroethane mixture at 23° C., using a relative viscometer operating with a closed loop system, which measures the solvent and sample viscosity simultaneously; from 8 to 15 weight percent of a talc filler having an average largest dimension of less than 0.9 micrometers, a median particle size of less than 0.9 micrometers, or both; and from 0.2 to 0.4 weight percent of an alkali metal salt, an alkaline earth metal salt, and/or a $C_{1-12}$ ester of an aliphatic $C_{24-36}$ carboxylic acid.

Also disclosed is a method of forming a metallized article, comprising molding a composition into a predetermined mold dimensioned to a lighting article, and thereby forming a molded lighting article; subjecting the molded lighting article to vacuum metallization, wherein the composition comprises, based on the total weight of the composition, from 44 to 80 weight percent of a thermoplastic poly(butylene terephthalate), from 20 to 50 weight percent of a thermoplastic poly(ethylene terephthalate) having an intrinsic viscosity of 0.5 to 0.8 deciliters per gram, measured in a 60:40 by weight phenol/1,1,2,2-tetrachloroethane mixture at 23° C., and measured on a relative viscometer operating with a closed loop system, which measures the solvent and sample viscosity simultaneously, from 5 to less than 20 weight percent of a talc filler having an average largest dimension of less than 0.9 micrometers, a median particle size of less than 0.9 micrometers, or both, and from 0.1 to 0.5 weight percent of a mold release agent; and wherein the metallized article is made without formation of a base coat.

Also disclosed is a method of forming an article, comprising shaping, extruding, or molding the above composition.

Also disclosed herein is an article comprising any of the above compositions.

BRIEF DESCRIPTION OF THE DRAWING

FIG. 1 is a bar graph showing gloss measurements before and after heat aging.

DETAILED DESCRIPTION OF THE INVENTION

Surprisingly, it has now been found that use of a particular type of filler in a polyester blend, together with a specific type of polyester, provides molded articles with low in-mold shrinkage and excellent surface characteristics. In particular, use of a talc having an average particle size of less than about 0.9 micrometers, a median particle size of less than 0.9 micrometers (or both of these characteristics), in combination with a blend of polyesters that includes a low viscosity poly(ethylene terephthalate) allows the manufacture of optical reflectors that have low in-mold shrinkage and smooth, surface defect-free, high-gloss surfaces. The surfaces can be satisfactorily metallized without use of an intermediate base coat, which allows a significant savings in production. An inorganic phosphorus compound is optionally present in the composition.

As used herein, the term "combination" is inclusive of blends, mixtures, alloys, reaction products, and the like. The singular forms "a," "an," and "the" include plural referents unless the context clearly dictates otherwise. All cited references are incorporated herein by reference.

Other than in the operating examples or where otherwise indicated, all numbers or expressions referring to quantities of ingredients, reaction conditions, and the like, used in the specification and claims are to be understood as modified in all instances by the term "about." Various numerical ranges are disclosed in this patent application. Because these ranges are continuous, they include every value between the minimum and maximum values. The endpoints of all ranges reciting the same characteristic or component are independently combinable and inclusive of the recited endpoint. Unless expressly indicated otherwise, the various numerical ranges specified in this application are approximations.

All ASTM tests and data are from the 2003 edition of the Annual Book of ASTM Standards unless otherwise indicated.

A wide variety of polyesters can be used in the thermoplastic compositions. Exemplary polyesters comprise structural units of the following formula:

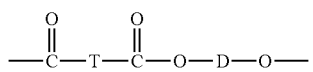

wherein each T is independently a divalent $C_1$-$C_{20}$ aliphatic radical, a divalent $C_3$-$C_{12}$ cycloaliphatic radical, or a divalent $C_6$-$C_{24}$ aromatic radical, each derived from a dicarboxylic acid or a chemical equivalent thereof, and each D is independently a divalent $C_1$-$C_{20}$ aliphatic radical, a divalent $C_3$-$C_{12}$ cycloaliphatic radical, a $C_6$-$C_{24}$ aromatic radical, each derived from a diol or a chemical equivalent thereof. Copolyesters containing a containing a combination comprising at least one of the foregoing types of T and/or D radicals can be used. The polyesters can be branched or linear.

Examples of aromatic dicarboxylic acids that can be used to prepare the polyesters include isophthalic acid, terephthalic acid, 1,2-di(p-carboxyphenyl)ethane, 4,4'-dicarboxydiphenyl ether, 4,4'-bisbenzoic acid, and combinations comprising at least one of the foregoing acids. Dicarboxylic acids containing fused rings can also be used, such as 1,4-, 1,5-, or 2,6-naphthalenedicarboxylic acids. Exemplary cycloaliphatic dicarboxylic acids include decahydronaphthalene dicarboxylic acids, norbornene dicarboxylic acids, bicyclooctane dicarboxylic acids, 1,4-cyclohexanedicarboxylic acid, and the like. Exemplary cycloaliphatic polyesters include 1,4-cyclohexane dicarboxylic acid (cis or trans), and the like. A specific dicarboxylic acid is a combination of isophthalic acid and terephthalic acid wherein the weight ratio of isophthalic acid to terephthalic acid is 91:9 to 2:98. Chemical equivalents of the diacids include the corresponding dialkyl esters, e.g., dimethyl esters, diaryl esters, anhydrides, salts, acid chlorides, and acid bromides.

Suitable $C_6$-$C_{12}$ aromatic diols include but are not limited to the diols of formula (2), for example resorcinol, hydroquinone, and pyrocatechol, as well as diols such as 1,5-naphthalene diol, 2,6-naphthalene diol, 1,4-napthalene diol, 4,4'-dihydroxybiphenyl, bis(4-hydroxyphenyl) ether, bis(4-hydroxyphenyl) sulfone, and the like, and combinations comprising at least one of the foregoing aromatic diols. Aliphatic and cycloaliphatic diols are more commonly used, for example 1,2-ethylene glycol, 1,2- and 1,3-propylene glycol, 2,2-dimethyl-1,3-propane diol, 2-ethyl-2-methyl-1,3-propane diol, 1,3- and 1,5-pentane diol, dipropylene glycol, 2-methyl-1,5-pentane diol, 1,6-hexane diol, dimethanol decalin, dimethanol bicyclooctane, 1,4-cyclohexane dimethanol and its cis- and trans-isomers, triethylene glycol, 1,10-decane diol, and the like. Chemical equivalents of the diols include dialkylesters such as dimethyl esters, diaryl esters, and the like.

Another class of polyesters includes at least one cycloaliphatic moiety, for example poly(1,4-cyclohexylene-dimethylene) terephthalate (PCT), poly(cyclohexane-1,4-dimethylene cyclohexane-1,4-dicarboxylate) (also referred to as poly(1,4-cyclohexane-dimethanol 1,4-dicarboxylate) (PCCD)), and poly(1,4-cyclohexylene dimethylene terephthalate-co-isophthalate) (PCTA). Other useful polyesters are copolyesters derived from an aromatic dicarboxylic acid and a mixture of linear aliphatic diols (specifically ethylene glycol, butylene glycol, poly(ethylene glycol) or poly(butylene glycol)) together with cycloaliphatic diols such as 1,6-hexane diol, dimethanol decalin, dimethanol bicyclooctane, 1,4-cyclohexane dimethanol and its cis- and trans-isomers, 1,10-decane diol, and the like. The ester units comprising the linear aliphatic or cycloaliphatic ester units can be present in the polymer chain as individual units, or as blocks of the same type of units. A specific ester of this type is poly(1,4-cyclohexylene dimethylene co-ethylene terephthalate) (PCTG) wherein greater than 50 mol % of the ester groups are derived from 1,4-cyclohexanedimethanol; and poly(ethylene-co-1,4-cyclohexylenedimethylene terephthalate) wherein greater than 50 mol % of the ester groups are derived from ethylene.

The polyesters can be obtained by interfacial polymerization or melt-process condensation, by solution phase condensation, or by transesterification polymerization wherein, for example, a dialkyl ester such as dimethyl terephthalate can be transesterified with ethylene glycol using acid catalysis, to generate poly(ethylene terephthalate). It is possible to use a branched polyester in which a branching agent, for example, a glycol having three or more hydroxyl groups or a trifunctional or multifunctional carboxylic acid has been incorporated. Furthermore, it is sometime desirable to have various concentrations of acid and hydroxyl end groups on the polyester, depending on the ultimate end use of the composition. Recycled polyesters and blends of recycled polyesters with virgin polyesters can also be used.

It has been found that compositions comprising polybutylene terephthalate (PBT) are of particular utility in obtaining compositions that have the desired properties. The PBT polymers can have an intrinsic viscosity of 0.4 to 2.0 deciliters per gram (dL/g), measured in a 60:40 by weight phenol/1,1,2,2-tetrachloroethane mixture at 23° C. The polyesters can have a weight average molecular weight of 10,000 to 200,000 Daltons, specifically 50,000 to 150,000 Daltons as measured by gel permeation chromatography (GPC). If PBT that has a weight average molecular weight less of than 10,000 Daltons is used, the mechanical properties of the compositions after molding are unsatisfactory. On the other hand, if the weight average molecular weight is greater than 200,000 Daltons, the moldability decreases. A mixture of PBT polymers having different intrinsic viscosities and/or molecular weights can be used.

It has unexpectedly been found that use of a low viscosity PET in addition to the PBT provides a thermoplastic molding composition having excellent gloss, even when a filler is used to provide dimensional stability the composition. In particular, it has been found that a PET having an intrinsic viscosity of 0.5 to 0.8 dL/g, measured in 60:40 by weight phenol/1,1,2,2-tetrachloroethane mixture at 23° C., is advantageous. Such determinations are readily performed with a relative viscometer operating with a closed loop system, which measures the solvent and sample viscosity simultaneously. The simultaneous measurement of the viscosity of the solvent and sample eliminates errors that can arise due to temperature fluctuation and solvent variation. In one embodiment, intrinsic viscosity is measured on a Viscotek relative viscometer Y501C equipped with an autosampler and two Mircolab 500 series pumps. In an exemplary process, a sample of 0.2 grams is weighed on an analytical balance and dissolved in 35 mL of 60:40 percent by weight mixture of phenol/1,1,2,2-tetrachloroethane mixture. Each sample is measured twice and an average of the two measurements is used recorded. A blank containing phenol and 1,1,2,2-tetrachloroethane is run prior to the measurements. At the end of the measurements, a phenol/1,1,2,2-tetrachloroethane wash is run to clean the apparatus.

In addition to PBT and a low intrinsic viscosity PET, the thermoplastic compositions can comprise other polyesters and/or other polymers, in an amount of 1 to 10 weight percent (wt. %), based on the total weight of the polymers in the compositions. For example, the thermoplastic compositions can comprise from 1 to 10 weight percent, based on the total weight of the polymers in the composition, of polyethylene naphthalate, polybutylene naphthalate, polytrimethylene terephthalate, poly(1,4-cyclohexylenedimethylene 1,4-cyclohexanedicarboxylate), poly(1,4-cyclohexylenedimethylene terephthalate), poly(cyclohexylenedimethylene-co-ethylene terephthalate), or a combination comprising at least one of the foregoing polyesters. Alternatively, the thermoplastic compositions can comprise from 1 to 10 weight percent, based on the total weight of the polymers in the composition, of a polycarbonate and/or an aromatic copolyester carbonate.

However, in a specific embodiment, the polymer component of the thermoplastic composition consists essentially of PBT and a low intrinsic viscosity PET. Such compositions have low shrinkage and excellent surface finish. In another embodiment, the compositions comprise a polymer component that consists of PBT and a low intrinsic viscosity PET.

The thermoplastic compositions further include a specific type of filler, in particular a talc filler having an average largest dimension of less than 0.9 micrometers. In addition, or in the alternative, the filler can have a median particle size of less than 0.9 micrometers. In one embodiment, the equivalent spherical diameter of the particle is used to determine particle size. Use of these types of filler in combination with PBT and a low intrinsic viscosity PET provides molded articles having both low shrinkage and a smooth surface finish. Use of these types of filler can also aid the crystallization of the polyester, and increase heat resistance of the composition. Such talcs are commercially available from Barretts Minerals Inc. under the trade name ULTRATALC® 609.

A mold release agent is further included in the thermoplastic composition. A wide variety of mold release agents can be used, for example phthalic acid esters such as dioctyl-4,5-epoxy-hexahydrophthalate; tristearin; poly-alpha-olefins; epoxidized soybean oil; silicones, including silicone oils; esters, for example, fatty acid esters such as alkyl stearyl esters, e.g., methyl stearate, stearyl stearate, pentaerythritol tetrastearate, and the like; combinations of methyl stearate and hydrophilic and hydrophobic nonionic surfactants comprising polyethylene glycol polymers, polypropylene glycol polymers, poly(ethylene glycol-co-propylene glycol) copolymers, or a combination comprising at least one of the foregoing glycol polymers, e.g., methyl stearate and polyethylene-polypropylene glycol copolymer in a suitable solvent; and waxes such as beeswax, paraffin wax, or the like. Such materials are generally used in amounts of 0.1 to 0.5 parts by weight, based on the total weight of the composition.

In one embodiment, the mold release agent is a salt or an ester of a long chain, aliphatic carboxylic acid having from 24 to 36 carbon atoms, more specifically 26 to 32 carbon atoms. In particular, montanic acid salts or montanic acid esters can be used as the mold release of this invention. Mixtures of two or more kinds of these montanic acid salts or montanic acid esters can also be used.

Suitable salts include metal salts, in particular alkali metal and alkaline earth metal salts of aliphatic $C_{24-36}$ monocarboxylic acids. Specific acid salts that can be used as mold releases are sodium montanate, potassium montanate, beryllium montanate, magnesium montanate, calcium montanate, lithium montanate, aluminum montanate, and the like. Montanic acids are acid mixtures that have as their primary component aliphatic monocarboxylic acids having 26 to 32 carbon atoms. Also, all or a portion of the montanic acid can be esterified with $C_{1-12}$ monovalent alcohols, divalent alcohols, and the like. Specific montanic acid esters are esters of montanic acid with alcohols having 2 to 10 carbon atoms, among these being diols such as ethylene glycol, 1,2- or 1,3-propanediol, 1,3- or 1,4-butanediol, and the like.

If these montanic acid salts or esters are used as mold release agents, the surfaces of the molded items are smooth, the gloss is superior, and the gloss does not change even when exposed to high temperature. Montanic acid salts or esters can be combined with conventionally used mold release agents in this invention, but montanic acid salts or esters are preferably used alone.

The thermoplastic composition can optionally further comprises inorganic phosphorus compounds as stabilizers. These inorganic phosphorus compounds are inorganic compounds selected from phosphoric acid, phosphorous acid, and metal salts of phosphoric acid and phosphorous acid; specifically, metal salts of phosphoric acid, such as zinc phosphate, potassium phosphate, sodium phosphate, aluminum phosphate, sodium pyrophosphate, etc., and their hydrates, and the corresponding metal phosphates, can be listed as metal salts of phosphoric acid and phosphorous acid. Among these, phosphate is preferred and zinc phosphate is particularly preferred. If these types of inorganic phosphates are used, out gassing is suppressed without degrading heat resistance, thereby obtaining molded items that have superior surface gloss that does not change even when exposed to heat. Such inorganic phosphorus compounds are generally used in amounts of 0.05 to 0.5 parts by weight, based on the total weight of the composition.

The thermoplastic composition can optionally further comprise any of the additives and property modifiers that polyesters are usually combined with, with the proviso that the additives are selected so as to not significantly adversely affect the desired properties of the composition, for example, shrinkage and/or surface gloss. Exemplary additives include, for example, antioxidants, flame retardants, heat stabilizers, light stabilizers, antistatic agents, colorants, and the like.

An antioxidant stabilizer composition can be used, for example a composition comprising a hindered diol stabilizer, a thioester stabilizer, an amine stabilizer, a phosphite stabilizer, or a combination comprising at least one of the foregoing types of stabilizers.

Suitable antioxidants are organophosphites such as tris(2, 6-di-tert-butylphenyl)phosphite, tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis[methylene(3,5-di-tert-butyl-4-hydroxyhydrocinnamate)]methane, commercially available from Geigy Chemical Company as IRGANOX 1010; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl)

propionate, pentaerythrityl-tetrakis(beta-lauryl thiopropionate) (available from Crompton Corporation under the trade name SEENOX 412S), or the like; amides of beta-(3,5-di-tert-butyl-4-hydroxyphenyl)-propionic acid or the like; or combinations comprising at least one of the foregoing antioxidants.

One exemplary antioxidant composition comprises tetrakis(2,4-di-tert-butylphenyl) 4,4'-biphenylene diphosphonite, which is available under the trade name SANDOSTAB® P-EPQ, from Clariant. Tetrakis(2,4-di-tert-butylphenyl) 4,4'-biphenylene diphosphonite and phosphoric acid can also be used, in a weight ratio of 80:20 to 20:80, specifically 70:30 to 30:70 can also be used. The antioxidant composition can also consist essentially of, or consist of, tetrakis[methylene(3,5-di-tert-butyl-4-hydroxyhydrocinnamate)]methane and pentaerythrityl-tetrakis(beta-lauryl thiopropionate), in a weight ratio of 30:60 to 70:30, specifically 40:60 to 60:40.

When present, the antioxidants are be used in an amount of 0.0001 wt. % to 2 wt. %, more specifically 0.01 wt. % to 1.2 wt. %, based on the total weight of the thermoplastic composition.

Suitable colorants include those known for use in molding compositions, and include inorganic and organic pigments and dyes. Exemplary colorants include metal oxides and oxide-hydroxides, mixed metal oxides, titanates, aluminates, carbonates, iron oxides, chromium oxides, ultramarines and metal sulfides, sulfoselenides, rare-earth sulfides, chromium iron oxides, chromium iron nickel spinel, chromium green, black hematite, bismuth vanadate, chromates, nitrides (including, but not limited to tantalum), iron blue, cobalt and manganese phosphates, europium complexes, and carbon black. Organic colorants include azo dyes, methine dyes, coumarins, pyrazolones, quinophthalones, quinacridones, perinones, anthraquinones, phthalocyanines, perylene derivatives, anthracene derivatives, indigoid and thioindigoid derivatives, imidazole derivatives, napthalimide derivatives, xanthenes, thioxanthenes, azine dyes, polyazaindacenes, benzoxazole, pyrazolines, fluoroscein, benzothiazole, hydroxyflavones, bis(hydroxyflavones), stilbenes, thiophene, rhodamines, and all their derivatives. Combinations of colorants can be used. When present, a colorant is used in an amount of 0.001 to 2 parts by weight, based on 100 parts by weight of the polyester.

The above thermoplastic compositions (or articles prepared therefrom) can exhibit a number of desirable properties, including good dimensional stability (such as low in-mold shrinkage), and/or a smooth surface appearance after molding. One or more of the forgoing properties are obtained using composition comprising from 44 to 80 wt. % of PBT, from 20 to 50 wt. % of a low intrinsic viscosity PET, from 5 to less than 20 wt. % of a talc filler having an average grain size of less than 0.9 micrometers, a median particles size of less than 0.9 micrometers, or both, and a from 0.1 to 0.5 wt. % of a mold release agent. Each of the foregoing amounts is based on the total weight of the thermoplastic composition. When an article is molded from this composition and a surface of the molded article is metallized, the metallized surface has a gloss of greater than 1700 units, measured at 20 degrees using a trigloss meter. In one embodiment, the surface of the article is metallized without use of an intervening base coat.

More specifically, good dimensional stability (such as low in-mold shrinkage), and/or a smooth surface appearance after molding can be obtained where the composition comprises from 50 to 70 wt. % of PBT, from 25 to 35 wt. % of low intrinsic viscosity PET, from 8 to 15 wt. % of a talc filler having an average grain size of less than 0.9 micrometers, a median particles size of less than 0.9 micrometers, or both, and from 0.2 to 0.4 wt. % of a mold release agent. Each of the foregoing amounts is based on the total weight of the thermoplastic composition. When an article is molded from this composition and a surface of the molded article is metallized, the metallized surface has a gloss of greater than 1700 units, measured at 20 degrees using a trigloss meter. In one embodiment, the surface of the article is metallized without use of an intervening base coat.

The thermoplastic compositions can be prepared by blending or kneading the above components. This blending and kneading can be performed using commonly used methods, for example, ribbon blenders, Henschel mixers, Banbury mixers, drum tumblers, single screw extruders, twin screw extruders, co-kneaders, multiscrew extruders, and the like. The temperature when kneading is usually selected from the range of 230 to 300° C.

Articles can then be shaped, extruded, or molded from the compositions. In particular, various known molding methods can be used, for example, injection molding, gas assist injection molding, vacuum molding, compression molding, rotary molding, and the like. Injection molding can be specifically mentioned.

A wide variety of articles can be manufactured using the thermoplastic compositions, including components for lighting articles, particularly optical reflectors. The optical reflectors can be used in automotive headlamps, headlamp bezels, headlight extensions and headlamp reflectors, for indoor illumination, for vehicle interior illumination, and the like.

In the manufacture of an optical reflector, the thermoplastic composition is molded, an optional base coat can be applied to a surface of the article, followed by metallization of the surface. In a specific advantageous embodiment, a base coat is not applied to a surface of the molded article prior to metallization. The surfaces of the molded items are smooth and good gloss can be obtained even by direct metal vapor deposition without treating the molded item with primer. Moreover, because the release properties of the molded item during injection molding are good, the surface properties of the molded item are superior without replication of mold unevenness.

Vacuum metallization is often used, which as used herein includes both vacuum deposition and vacuum sputtering processes. Chrome, nickel, aluminum, and the like can be listed as examples of vaporizing metals. Aluminum vapor deposition is often used. The surface of the molded item can be cleaned and degreased before vapor deposition in order to increase adhesion.

The articles, in particular lighting articles, have very low mold shrinkage, have good surface gloss even when metal layers are directly vapor deposited, there is no residue on the mold after long molding runs, and the vapor deposited surfaces do not become cloudy or have rainbow patterns even on heating of the vapor deposited surface. The articles further have good heat stability.

In particular, in one embodiment, an article molded from the thermoplastic compositions (via, e.g., injection molding) has a heat deflection temperature of 160° C. or greater, specifically 165° C. or greater, measured at 455 kilopascals (66 psi) in accordance with ASTM D648. In another embodiment, an article molded from the thermoplastic compositions (via, e.g., injection molding) has a heat deflection temperature of 160° C. or greater, specifically 165° C. or greater, measured at 1.82 megapascals (MPa, 264 psi) in accordance with ASTM D648. An article molded from the thermoplastic compositions (via, e.g., injection molding) can also have a mold shrinkage of less than 2%, specifically less than 1.5%, measured in both the flow and crossflow directions. In a specific embodiment, an article molded from the thermoplastic compositions (via, e.g., injection molding) has a heat deflection temperature of 165° C., measured at 455 kilopascals (66 psi) in accordance with ASTM D648, and a mold shrinkage of less than 1.5%, measured in both the flow and crossflow directions. In another specific embodiment, an article molded from the thermoplastic compositions (via, e.g., injection molding) has a heat deflection temperature of 165° C., measured at 1.82 MPa (264 psi) in accordance with ASTM D648, and a mold shrinkage of less than 1.5%, measured in both the flow and crossflow directions.

In another embodiment, an article molded from the thermoplastic compositions (via, e.g., injection molding) has no surface defects visible to the eye on a surface thereof. In another embodiment, when a surface of the molded article is metallized, the metallized surface has no surface defects visible to the eye. A base coat can be present between the article and the metallized surface, or the surface of the article can be directly metallized without a base coat.

In still another embodiment, a surface of an article molded from the thermoplastic compositions (via, e.g., injection molding) exhibits a gloss of greater than 95 units, measured at 20 degrees using a trigloss meter. In another embodiment, when a surface of the molded article is metallized, the metallized surface has a gloss of greater than 1700 units, measured at 20 degrees using a trigloss meter. A base coat can be present between the article and the metallized surface, or the surface of the article can be directly metallized without a base coat.

The gloss of the molded articles is further heat stable. For example, there is provided an article formed from the compositions (via, e.g., injection molding), and having a metallized surface, wherein the metallized surface retains 95% or more of its gloss after heat aging at 150° C. for 1 hour, measured at 20 degrees using a trigloss meter. A base coat can be present between the article and the metallized surface, or the surface of the article can be directly metallized without a base coat.

There is also provided an article formed from the compositions (via, e.g., injection molding), and having a metallized surface, wherein the metallized surface retains 90% or more of its gloss after heat aging at 160° C. for 1 hour, measured at 20 degrees using a trigloss meter. A base coat can be present between the article and the metallized surface, or the surface of the article can be directly metallized without a base coat.

In another embodiment there is provided an article formed from the compositions, specifically a composition having up to 2 wt. % of a particulate filler, or no filler, and having a metallized surface, wherein the metallized surface retains 95% or more of its gloss after heat aging at 150° C. for 1 hour, measured at 20 degrees using a tri gloss meter. An undercoat can be present between the article and the metallized surface, or a surface of the article can be directly metallized.

The invention is further illustrated by the following examples, which are not limiting.

EXAMPLES

A formulation suitable for molding a base coat-free lamp bezel or other article is shown in Table 1, wherein all amounts are in weight percent, based on the total weight of the formulation.

TABLE 1

| Component | Trade Name | Supplier | Amount (Example 1) |
|---|---|---|---|
| PBT | VALOX 315 | GE Plastics | 19.4 |
| PBT | PBT 195 | GE Plastics | 40.11 |
| PET, low intrinsic viscosity | FUTURA PET | Futura Polymers | 30 |
| Talc | ULTRATALC ® 609 | Barretts Minerals Inc. | 10 |
| Hindered phenol stabilizer | IRGANOX 1010 | Ciba | 0.04 |
| Phosphonous acid ester | SANDOSTAB PEPQ | Clariant | 0.15 |
| Sodium montanate | LICOMONT NAV 101 | Clariant | 0.3 |

Intrinsic viscosity (IV) data were collected on a Viscotek relative viscometer Y501C equipped with an autosampler and two Microlab 500 series pumps. A sample of 0.2 grams was weighed on an analytical balance and dissolved in 35 mL of 60:40 percent by weight mixture of phenol/1,1,2,2-tetrachloroethane mixture. Each sample was measured twice and an average of the two measurements was recorded. A blank containing phenol and 1,1,2,2-tetrachloroethane was run prior to the measurements. At the end of the measurements, a phenol/1,1,2,2-tetrachloroethane wash was run to clean the apparatus.

The above components in the proportions shown in Table 1 were mixed, extruded through a twin-screw extruder set at 250° C., 200 rpm and 100 kg/h, and made into pellets. The pellets were dried and 100×60×3 mm flat molded items and samples for property measurements were obtained by injection molding. A van Dorn injection-molding machine was used with following temperature profile (rear to front): 554, 570, 570, 590° F. (290, 299, 299, 310° C.). Typical settings were as follows: 100 rpm screw speed, 600 pounds per square inch (psi, 4.13 MPa) hold pressure, 75 psi (0.52 MPa) back pressure, and 30 sec cycle times. Temperatures at the front of the barrel and hold/back pressures were adjusted to accommodate differences in the processability between formulations. Compounded pellets were dried for 3-4 hours at 250° F. (121° C.) in an air-circulating oven prior to molding. Molding was carried out using mirror surface molds so as to obtain a high gloss class "A" surface finish. The molded samples were subsequently metallized (direct vapor deposition of aluminum, 0.9 micrometer thick) with a base coat (Example 1A) and without a base coat (Example 1B), followed by a standard plasma topcoat.

In addition to the above Examples 1A and 1B, samples for two Comparative Examples were molded and metallized. Comparative Example 2 is similar to Example 1, but does not contain any filler. The sample was molded and metallized as described above without a base coat. Comparative Example 3 is a commercially available polyester molding composition (CRASTIN-CE2055 from DuPont, containing 13% titanium dioxide filler). The sample was molded in accordance with the manufacturer's instructions, and metallized without a base coat.

Metallized gloss measurements were carried out using a BKY Gardner trigloss instrument. Measurements were recorded at 20 degrees. To determine gloss before and after heat aging, 4 inch×4 inch (10.2 cm×10.2 cm) molded plaques were tested before and after aging at 160° C. for 1 hour.

FIG. 1 shows the comparative gloss properties of Examples 1A and 1B, and Comparative Examples 2 and 3. As can be seen from the FIGURE, the base coat-free formulation of the invention (Example 1B) has a gloss similar to the unfilled sample (Comparative Example 2), the base coated example in accordance with the invention, (Example 1A), and the comparative Example 3. In addition, the base coat-free formulation of Example 1B retains gloss similar to the base coated Example 1A upon heat treatment.

Table 2 below shows a comparison of the physical properties of Examples 1A and 1B, as well as Comparative Examples 2 and 3.

Each standard test method was carried out on five 0.125 inch (3.2 mm) samples. Heat deflection temperature (264 psi (1.82 MPa) and 66 psi (0.455 MPa), annealed), was measured in accordance with ASTM D648.

Mold shrinkage tests were performed on circular disks having a thickness of 0.125 inch (3.2 mm) and a diameter of 4 inches (10.2 cm). Mold shrinkage was measured with and cross flow directions of the polymer flow.

Modulus of elasticity, stress at yield, and elongation at yield were measured in accordance ASTM D 638 at 25° C.

Melt volume flow ratio was measured at the indicated temperature (250° C. or 265° C.) under a load of 2.16 Kg or 5 Kg in accordance with ISO 1133.

TABLE 2

| Properties | Units | Ex. 1A | Ex. 1B | Comp. Ex. 3 | Comp. Ex. 2 |
|---|---|---|---|---|---|
| Heat Deflection Temperature (HDT), 3.2 mm, annealed | | | | | |
| HDT, 264 psi (1.82 MPa) | ° C. | 170 | 168 | 165 | 165 |
| HDT, 66 psi (0.455 MPa) | ° C. | 69 | 64 | 54 | 56 |
| Mold Shrinkage, 3.2 mm | | | | | |
| Perpendicular | % | 1.47 | 1.65 | 2.3 | 2.4 |
| Tensile, 3.2 mm, 5 mm/min | | | | | |
| Modulus of Elasticity | MPa | 6020 | 3530 | 2630 | 2730 |
| Stress at Yield | MPa | 55.1 | 51.3 | 55 | 57 |
| Elongation at Yield | % | 2.2 | 3.1 | 9 | 11 |
| MVR 265, 2.16 kg, 340 s | cm³/10 min | — | 88 | — | — |
| MVR 250, 2.16 kg, 340 s | cm³/10 min | — | — | 48 | 39 |
| MVR 250, 5 kg, 340 s | cm³/10 min | 5 | — | — | — |

As can be seen from the above data, the base coat free formulation of Example 1B has heat (HDT) and mold shrinkage values similar to those of base coated Example 1A.

While the invention has been illustrated and described in typical embodiments, it is not intended to be limited to the details shown, since various modifications and substitutions are possible without departing from the spirit of the present invention. As such, modifications and equivalents of the invention herein disclosed may occur to persons skilled in the art using no more than routine experimentation, and all such modifications and equivalents within the spirit and scope of the invention as defined by the following claims.

What is claimed is:

1. An article having a metallized surface formed by vacuum metallization comprising an extruded composition consisting of, based on the total weight of the extruded composition,
   (a) from 44 to 80 weight percent of a thermoplastic poly (butylene terephthalate) having a weight average molecular weight of 10,000 to 200,000 Daltons;
   (b) from 20 to 50 weight percent of a thermoplastic poly (ethylene terephthalate) having an intrinsic viscosity of 0.5 to 0.8 deciliters per gram, measured in a 60:40 by weight phenol/1,1,2,2-tetrachloroethane mixture at 23° C., using a relative viscometer operating with a closed loop system, which measures the solvent and sample viscosity simultaneously;
   (c) from 5 to less than 20 weight percent of a talc filler having an average largest dimension of less than 0.9 micrometers, a median particles size of less than 0.9 micrometers, or both;
   (d) from 0.1 to 0.5 weight percent of a mold release agent;
   (e) optionally, a polyester selected from the group consisting of polyethylene naphthalate, polybutylene naphthalate, polytrimethylene terephthalate, poly(1,4-cyclohexylenedimethylene 1,4-cyclohexanedicarboxylate), poly(1,4-cyclohexylenedimethylene terephthalate), poly(cyclohexylenedimethylene-co-ethylene terephthalate), and combinations thereof;
   (f) optionally, a polycarbonate and/or an aromatic copolyester carbonate;
   (g) optionally, an inorganic phosphorous compound selected from the group consisting of phosphoric acid, phosphorous acid, and metal salts of phosphoric acid and phosphorous acid; and
   (h) optionally, at least one additive selected from the group consisting of antioxidants, flame retardant, heat stabilizers, light stabilizers, antistatic agents and colorants;
   wherein the metallized surface of the article, retains 90% or more of its gloss after heat aging at 160° C. for 1 hour, measured at 20 degrees using a trigloss meter.

2. The article of claim 1, wherein the polyester selected from the group consisting of polyethylene naphthalate, polybutylene naphthalate, polytrimethylene terephthalate, poly(1,4-cyclohexylenedimethylene 1,4-cyclohexanedicarboxylate), poly(1,4-cyclohexylenedimethylene terephthalate), poly(cyclohexylenedimethylene-co-ethylene terephthalate), and combinations thereof is present in an amount from 1 to 10 weight percent, based on the total weight of the polymers in the composition.

3. The article of claim 1, wherein the polycarbonate and/or an aromatic copolyester carbonate is present in an amount from 1 to 10 weight percent, based on the total weight of the polymers in the composition.

4. The article of claim 1, wherein the mold release agent comprises an alkali metal salt, an alkaline earth metal salt, and/or a $C_{1-12}$ ester of an aliphatic $C_{24-36}$ carboxylic acid.

5. The article of claim 4, wherein the salt is an alkali metal and the carboxylic acid is a $C_{26-36}$ carboxylic acid.

6. The article of claim 1, wherein the inorganic phosphorous compound is present in an amount from 0.05 to 0.5 weight percent, based on the total weight of the polymers in the composition.

7. The article of claim 1, wherein an article molded from the composition exhibits a heat deflection temperature of 165° C. at 66 psi and a crossflow and flow mold shrinkage of less than 1.5%.

8. The article of claim 1, wherein the article exhibits a gloss that is more than 95 gloss units, as measured at 20 degrees using a trigloss meter.

9. The article of claim 1, having no surface defects visible to the eye.

10. The article of claim 1, wherein the metallized surface of the article does not exhibit any visible surface defects.

11. The article of claim 10, wherein the article is in the form of a component of a headlamp.

12. The article of claim 11, wherein the article is in the form of a headlamp bezel.

13. The article of claim 10, wherein the metallized surface exhibits a gloss that is more than 1700 gloss units, as measured at 20 degrees using a trigloss meter.

14. The article of claim 13, wherein the metallized surface has no basecoat.

15. The article of claim 10, wherein the metallized surface has no basecoat.

16. The article of claim 1, wherein the metallized surface retains 95% or more of its gloss after heat aging at 150° C. for 1 hour, measured at 20 degrees using a trigloss meter.

17. The article of claim 16, wherein the metallized surface has no basecoat.

18. The article of claim 1, wherein the inorganic phosphorous compound is selected from the group consisting of zinc phosphate, potassium phosphate, sodium phosphate, aluminum phosphate, sodium pyrophosphate, and combinations thereof.

19. A method of forming a metallized article, comprising injection molding a composition into a mold dimensioned to a lighting article, and thereby forming an injection molded lighting article; subjecting the injection molded lighting article to vacuum metallization, thereby forming a metallized surface on the injection molded article, wherein the composition of metalized article consists of, based on the total weight of the composition, an extruded combination of
- (a) from 44 to 80 weight percent of a thermoplastic poly (butylene terephthalate) having a weight average molecular weight of 10,000 to 200,000 Daltons;
- (b) from 20 to 50 weight percent of a thermoplastic poly (ethylene terephthalate having an intrinsic viscosity of 0.5 to 0.8 deciliters per gram, measured in a 60:40 by weight phenol/1,1,2,2-tetrachloroethane mixture at 23° C., and measured on a relative viscometer operating with a closed loop system, which measures solvent and sample viscosity simultaneously;
- (c) from 5 to less than 20 weight percent of a talc filler having an average largest dimension of less than 0.9 micrometers, a median particle size of less than 0.9 micrometers, or both,
- (d) from 0.1 to 0.5 weight percent of a mold release agent;
- (e) optionally, a polyester selected from the group consisting of polyethylene naphthalate, polybutylene naphthalate, polytrimethylene terephthalate, poly(1,4-cyclohexylenedimethylene 1,4-cyclohexanedicarboxylate), poly(1,4-cyclohexylenedimethylene terephthalate), poly(cyclohexylenedimethylene-co-ethylene terephthalate), and combinations thereof;
- (f) optionally a polycarbonate and/or an aromatic copolyester carbonate;
- (g) optionally an inorganic phosphorous compound selected from the group consisting of phosphoric acid, phosphorous acid, and metal salts of phosphoric acid and phosphorous acid; and
- (h) optionally, at least one additive selected from the group consisting of antioxidants, flame retardant, heat stabilizers, light stabilizers, antistatic agents and colorants;
- wherein the metallized article is made without formation of a base coat; and wherein a metallized surface on an article that is injection molded from the composition retains 90% or more of its gloss after heat aging at 160° C. for 1 hour, measured at 20 degrees using a trigloss meter.

20. An article having a metallized surface formed by vacuum metallization comprising an extruded composition consisting of based on the total weight of the composition, an extruded combination of
- (a) from 50 to 70 weight percent of a thermoplastic poly (butylene terephthalate) having a weight average molecular weight of 10,000 to 200,000 Daltons;
- (b) from 25 to 35 weight percent of a thermoplastic poly (ethylene terephthalate) having an intrinsic viscosity of 0.5 to 0.8 deciliters per gram, measured in a 60:40 by weight phenol/1,1,2,2-tetrachloroethane mixture at 23° C. using a relative viscometer operating with a closed loop system, which measures the solvent and sample viscosity simultaneously;
- (c) from 8 to 15 weight percent of a talc filler having an average largest dimension of less than 0.9 micrometers, a median particle size of less than 0.9 micrometers, or both; and
- (d) from 0.2 to 0.4 weight percent of an alkali metal salt, an alkaline earth metal salt, and/or a $C_{1-12}$ ester of an aliphatic $C_{24-36}$ carboxylic acid,
- (e) optionally, a polyester selected from the groups consisting of polyethylene naphthalate, polybutylene naphthalate, polytrimethylene terephthalate, poly(1,4-cyclohexylenedimethylene 1,4-cyclohexanedicarboxylate), poly(1,4-cyclohexylenedimethylene terephthalate), poly(cyclohexylenedimethylene-co-ethylene terephthalate), and combinations thereof;
- (f) optionally, a polycarbonate and/or an aromatic copolyester carbonate;
- (g) optionally, an inorganic phosphorous compound selected from the group consisting of phosphoric acid, phosphorous acid, and metal salts of phosphoric acid and phosphorous acid; and
- (h) optionally, at least one additive selected from the group consisting of antioxidants, flame retardant, heat stabilizers, light stabilizers, antistatic agents and colorants;
- wherein a metallized surface, formed by vacuum metallization, on an article that is injection molded from the composition retains 90% or more of its gloss after heat aging at 160° C. for 1 hour, measured at 20 degrees using a trigloss meter.

21. The article of claim 20, wherein the article is in the form of a lighting article.

22. The article of claim 21, wherein the metallized surface does not exhibit any visible surface defects.

23. The article of claim 22, wherein the metallized surface exhibits a gloss that is more than 1700 gloss units, measured at 20 degrees using a trigloss meter.

* * * * *